United States Patent
Sato et al.

(10) Patent No.: US 9,953,886 B2
(45) Date of Patent: Apr. 24, 2018

(54) SINGLE-WAFER REAL-TIME ETCH RATE AND UNIFORMITY PREDICTOR FOR PLASMA ETCH PROCESSES

(71) Applicant: Microchip Technology Incorporated, Chandler, AZ (US)

(72) Inventors: Justin Hiroki Sato, West Linn, OR (US); Brian Dee Hennes, Portland, OR (US); Yannick Carll Kimmel, New York, NY (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/242,051

(22) Filed: Aug. 19, 2016

(65) Prior Publication Data

US 2017/0053841 A1 Feb. 23, 2017

Related U.S. Application Data

(60) Provisional application No. 62/208,295, filed on Aug. 21, 2015.

(51) Int. Cl.
*H01L 21/66* (2006.01)
*H01J 37/32* (2006.01)
(Continued)

(52) U.S. Cl.
CPC ........ *H01L 22/12* (2013.01); *H01J 37/32935* (2013.01); *H01J 37/32963* (2013.01);
(Continued)

(58) Field of Classification Search
CPC combination set(s) only.
See application file for complete search history.

(56) References Cited

U.S. PATENT DOCUMENTS

2003/0119215 A1 6/2003 Joseph, Jr. .................. 438/14
2006/0141798 A1 6/2006 Jo .............................. 438/725
(Continued)

OTHER PUBLICATIONS

International Search Report and Written Opinion, Application No. PCT/US2016/047947, 11 pages, dated Nov. 2, 2016.

*Primary Examiner* — Ratisha Mehta
(74) *Attorney, Agent, or Firm* — Slayden Grubert Beard PLLC

(57) ABSTRACT

The present disclosure relates to semiconductor manufacturing, in particular to a real-time method for qualifying the etch rate for plasma etch processes. A method for testing a semiconductor plasma etch chamber may include: depositing a film on a substrate of a wafer, the wafer including a center region and an edge region; depositing photoresist on top of the film in a pattern that isolates the center region from the edge region of the wafer; and performing an etch process on the wafer that includes at least three process steps. The three process steps may include: etching the film in any areas without photoresist covering the areas until a first clear endpoint signal is achieved; performing an in-situ ash to remove any photoresist; and etching the film in any areas exposed by the removal of the photoresist until a second clear endpoint is achieved. The method may further include determining whether both endpoints are achieved within respective previously set tolerances, and, if both endpoints are achieved within the previously set tolerance, qualifying the plasma etch chamber as verified.

17 Claims, 3 Drawing Sheets

(51) Int. Cl.
*H01L 21/02* (2006.01)
*H01L 21/027* (2006.01)
*H01L 21/3065* (2006.01)
*H01L 21/308* (2006.01)

(52) U.S. Cl.
CPC .... H01L 21/0274 (2013.01); H01L 21/02164 (2013.01); H01L 21/3065 (2013.01); H01L 21/3081 (2013.01); H01J 2237/334 (2013.01); H01J 2237/3343 (2013.01)

(56) References Cited

U.S. PATENT DOCUMENTS

| | | | |
|---|---|---|---|
| 2007/0059933 A1* | 3/2007 | Tahara | G03F 7/427 438/689 |
| 2008/0176149 A1* | 7/2008 | Grimbergen | C23F 4/00 430/5 |
| 2009/0146145 A1* | 6/2009 | Sasahara | H01L 22/12 257/48 |
| 2015/0180198 A1* | 6/2015 | Kishimoto | H01S 5/2275 438/16 |

* cited by examiner

SINGLE-WAFER REAL-TIME ETCH RATE AND UNIFORMITY PREDICTOR FOR PLASMA ETCH PROCESSES

CROSS-REFERENCE TO RELATED APPLICATIONS

This application claims priority to commonly owned U.S. Provisional Patent Application No. 62/208,295 filed Aug. 21, 2015, which is hereby incorporated by reference herein for all purposes.

TECHNICAL FIELD

The present disclosure relates to semiconductor manufacturing, in particular to a real-time method for qualifying the etch rate for plasma etch processes.

BACKGROUND

One way to make semiconductor fabrication facilities more efficient includes combining multiple wafer processes to running in a single plasma chamber. The differences, however, between the various processes and/or type of wafer loading can cause varying chamber conditions. Plasma etching is typically used to fabricate integrated circuits and involves bombarding a sample with pulses of a high-speed plasma discharge. In each case, the gas etch chemistry forms volatile chemical compounds with the material being etched. Running multiple processes in a single plasma chamber may, for example, leave traces of the volatile compounds in the chamber. This variation between processes may detrimentally affect subsequent wafer processes, especially in relation to more advanced technologies.

SUMMARY

The teachings of the present disclosure may provide various methods to qualify etch rate and uniformity on a plasma etch chamber, in real-time, with a single wafer run. The processes taught herein may reduce and/or eliminate scrap/out of control material resulting from changes in the etch chamber conditions. In addition, the plasma chamber can be qualified without post-measuring wafers on metrology equipment. Some embodiments may include an automatic feedback loop. Real-time metrology methods that monitor and correlate all input and output available at a plasma etch tool may predict general stability of the process (which is, in turn, related to etch rate), but does not reliably represent uniformity of the etch rate across the sample.

In some embodiments, a method for testing a semiconductor plasma etch chamber may include: depositing a film on a substrate of a wafer, the wafer including a center region and an edge region; depositing photoresist on top of the film in a pattern that isolates the center region from the edge region of the wafer; and performing an etch process on the wafer that includes at least three process steps. The three process steps may include: etching the film in any areas without photoresist covering the areas until a first clear endpoint signal is achieved; performing an in-situ ash to remove any photoresist; and etching the film in any areas exposed by the removal of the photoresist until a second clear endpoint is achieved. The method may further include determining whether both endpoints are achieved within respective previously set tolerances, and, if both endpoints are achieved within the previously set tolerance, qualifying the plasma etch chamber as verified.

In some embodiments, the photoresist is deposited in a pattern that covers the film disposed in the center region of the wafer and exposes the film deposited in the edge region of the wafer.

In some embodiments, the previously set tolerance corresponding to the first clear endpoint reflects an edge etch rate for the plasma chamber.

In some embodiments, the previously set tolerance corresponding to the second clear endpoint reflects a center etch rate for the plasma chamber.

In some embodiments, the method may include measuring the film after it is deposited on the substrate and before depositing the photoresist.

In some embodiments, the wafer is stored for up to three months after deposition of the photoresist and before preforming the etch process.

In some embodiments, the film comprises silicon dioxide.

In some embodiments, the method may include printing the photoresist with a mask-less photolithography process.

In some embodiments, the method may include measuring the thickness of the film to compare to a predetermined tolerance before depositing the photoresist.

In some embodiments, a method for testing an etch rate uniformity for a plasma etch chamber, may include: etching an exposed portion of film on an edge region of a wafer, while a center region of the wafer is protected by photoresist and recording an etch rate for the edge region; performing an ash process to remove the photoresist form the center region of the wafer; and etching the center region of the wafer and recording an etch rate for the center region.

In some embodiments, the method may include comparing the etch rate for the edge region and the etch rate for the center region against respective predetermined thresholds.

In some embodiments, the method may include approving the plasma chamber as qualified if both etch rates fall within the respective predetermined thresholds.

In some embodiments, the method may include depositing the film on the wafer.

In some embodiments, the method may include depositing the film on the wafer; and depositing photoresist on the film in a pattern that exposes the edge region of the wafer and the film thereon.

In some embodiments, the film comprises silicon dioxide.

In some embodiments, the method may include: depositing the film on the wafer; and measuring the thickness of the film to compare to a predetermined tolerance.

DETAILED DESCRIPTION

The teachings of the present disclosure may provide various methods to qualify etch rate and uniformity on a plasma etch chamber, in real-time, with a single wafer run. The processes taught herein may reduce and/or eliminate scrap/out of control material resulting from changes in the etch chamber conditions.

Typical qualification runs employed between varying plasma etch processes may take more than thirty minutes to complete. In many cases, the time depends heavily on the time required to measure and verify data after the etch runs are completed, often using separate metrology equipment. For example, laser interferometers and CCD arrays are expensive and difficult to incorporate with existing plasma etch process tools.

The example processes herein may be used to test and confirm etch rate and uniformity without these time-consuming measurement steps. The example processes as well as others incorporating the teachings of the present disclosure may provide an efficient and inexpensive method for real-time qualification of semiconductor process tools without requiring upgrading the tools. The incorporated real-time metrology can alert and/or shutdown conditions outside of specifications without requiring data review or separate metrology steps.

Figure 1:
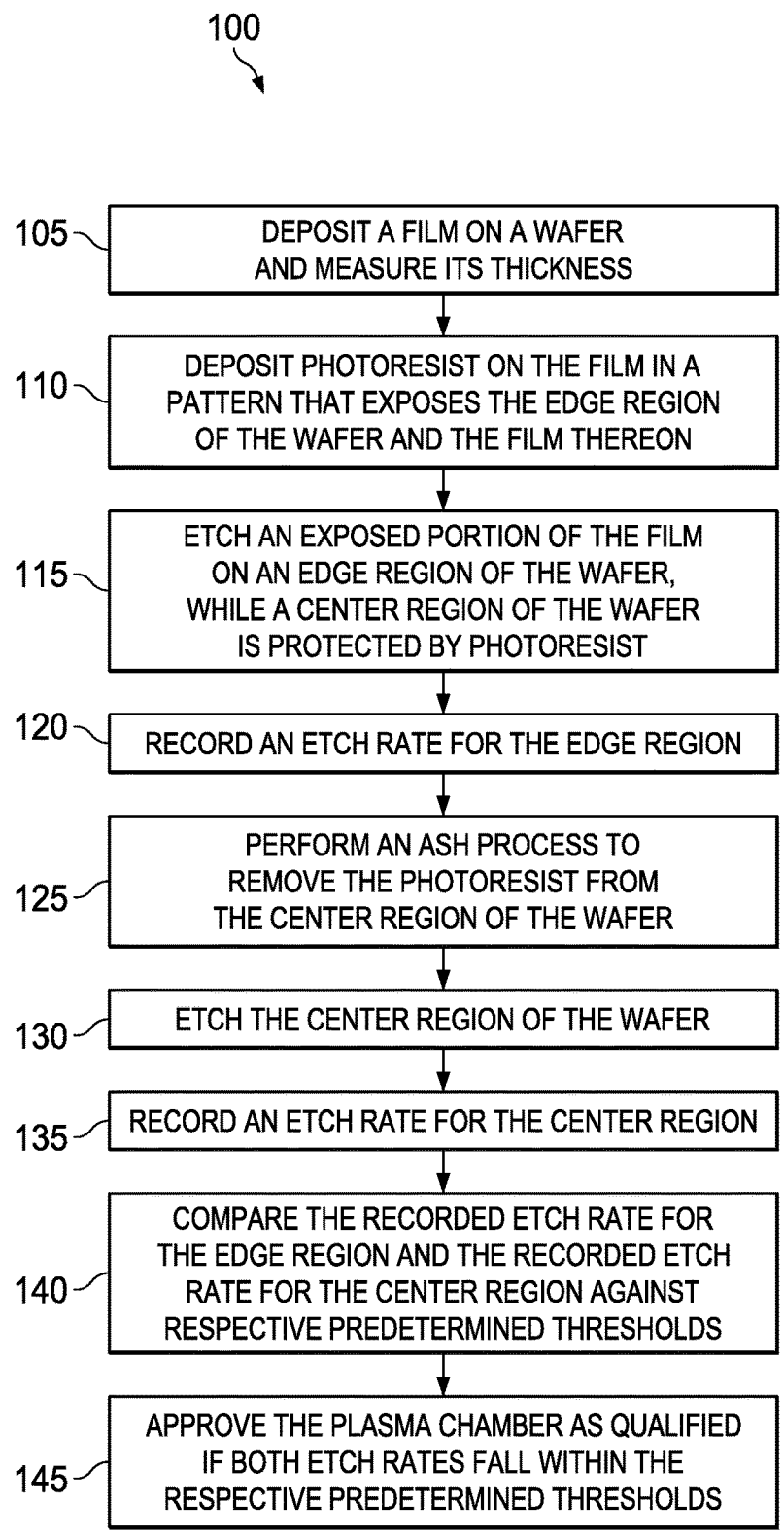
FIG. 1 is a flowchart showing an example method for qualifying the etch rate of a plasma etch chamber according to teachings of the present disclosure.

FIG. 1 is a flowchart showing an example method 100 for qualifying the etch rate of a plasma etch chamber according to teachings of the present disclosure.

At Step 105, method 100 may include depositing a film on a wafer and measuring its thickness. In some embodiments, the film may comprise silicon dioxide (SiO2). The thickness of the film may be compared against any predetermined standard appropriate for testing the etch rate of a plasma etch chamber. In some embodiments, the film may be of a given target thickness allowing for a clear endpoint to the etch procedures to be qualified. Example methods for depositing the film may include chemical vapor deposition (CVD) or growing with an oxygen plasma process.

At Step 110, method 100 may include depositing photoresist on the film in a pattern that exposes the edge region of the wafer and the film thereon. Photoresist may comprise either a positive or a negative resist. The photoresist may be printed onto the film and wafer using mask-less photolithography and/or any appropriate process. In some embodiments of the method, the wafers may be stored after step 110 to be used over a period of time. In some examples, the wafers may be stored for up to three months.

At Step 115, method 100 may include etching an exposed portion of the film on an edge region of the wafer, while a center region of the wafer is protected by the photoresist. In some examples, the film is etched using a plasma etch process that is the target process for qualification of the plasma etch chamber. Various etch parameters may define the process, such as electron source, pressure in the chamber, gas species, and/or vacuum/pressure level. In other embodiments, the photoresist may protect the edge region of the film and expose the center.

At Step 120, method 100 may include recording an etch rate for the edge region, reflecting the etch rate of the process employed for Step 115. The etch rate may indicate the amount of film removed over unit time (examples are discussed in relation to FIG. 4).

At Step 125, method 100 may include performing an ash process to remove the photoresist from the center region of the wafer. Plasma ashing may refer to a process for removing photoresist from a wafer after an etching process. In typical plasma ashing, a plasma source produces a reactive species (e.g., a monatomic or single atom substance) such as oxygen or fluorine. The reactive species reacts with the photoresist to form an ash which may be removed by a vacuum pump and/or other processes. High temperature ashing (also known as stripping) may be performed to remove all remaining photoresist. In other embodiments of method 100, a lower temperature ashing may be used. Lower temperature ashing may be referred to as "descum" and is typically used to remove residual photoresist from etched structures.

At Step 130, method 100 may include etching the center region of the wafer. The center region was protected during the etching of Step 115, but is now exposed after the plasma ashing of Step 125. In some examples, the etch process of Step 130 is the same process as that used in Step 115.

At Step 135, method 100 may include recording an etch rate for the center region as processed in Step 130. The etch rate may reflect the amount of film removed over unit time (as reflected in FIG. 4).

At Step 140, method 100 may include comparing the recorded etch rate for the edge region and the recorded etch rate for the center region against respective predetermined thresholds. The predetermined thresholds may be set based on the particular plasma etch processes and the particular film.

At Step 145, method 100 may include approving the plasma chamber as qualified if both etch rates fall within the respective predetermined thresholds.

According to another exemplary process, a method may include the following steps:

1. Deposit a film of interest on a wafer substrate.
2. Measure the film thickness using appropriate metrology, if the wafer is within set specifications proceed to step 3.
3. Pattern the wafer with photoresist in a manner that isolates the center and edge of the wafer.
4. Perform a plasma etch on the wafer that includes a minimum of three process steps;
   4a. The etch of interest, is run until a clear endpoint signal is achieved.
   4b. An in-situ ash to remove the resist that is isolating the center from the edge of the wafer during the first etch.
   4c. The etch of interest again, is run until a second clear endpoint is achieved.
5. If endpoints are achieved within a previously set tolerance, the center and edge etch rates should be within specification and the chamber is qualified.

In the various embodiments, a real-time test checks the etch rate and uniformity without separate measurement on stand-alone metrology equipment. Thus, the system may have an automatic feedback loop and can be implemented on nearly any plasma etch chamber. These methods stand in contrast to conventional processes using dual (or more) laser interferometers in-situ because those are very expensive and may be unavailable for a manufacturer's process tools. Alternatively, CCD arrays are also very expensive and may be unavailable for a semiconductor manufacturer's process tools. Real-time metrology to monitor and correlate all inputs/outputs may be available at the tool while processing to predict process stability and although it can predict general stability of the process which is related to the etch rate, it may not accurately represent uniformity.

Figure 2:
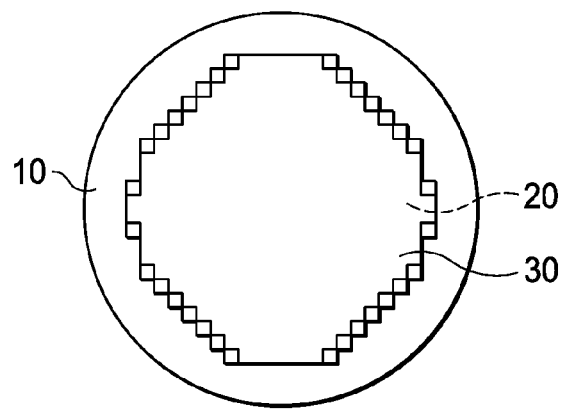
FIG. 2 is a drawing illustrating a semiconductor wafer with an example photoresist pattern that may be used in various methods according to teachings of the present disclosure.

FIG. 2 is a drawing illustrating a semiconductor wafer 10 with an example photoresist pattern 30 that may be used in various methods according to teachings of the present disclosure. According to various embodiments, semiconductor wafer 10 may include a film 20 of interest (e.g., Silicon dioxide or another oxide) deposited with a certain target thickness that allows for a clear endpoint for the plasma etch processes to be qualified. In some embodiments, the film is measured to verify it is within the spec limits.

The designated photoresist pattern 30 may be printed using mask-less photolithography or with an optical mask. In either case, a pattern 30 is formed in the photoresist by exposing it to light. As used in the processes of the present disclosure, the use of a mask may increase complexity and processing steps without improving the performance. The pattern 30 isolates the center region of the wafer 10 from the edge region, but may not require precision dimensions or other features better produced with a mask. After the pattern is created, the wafers may be stored for up to 3 months.

Figure 3:
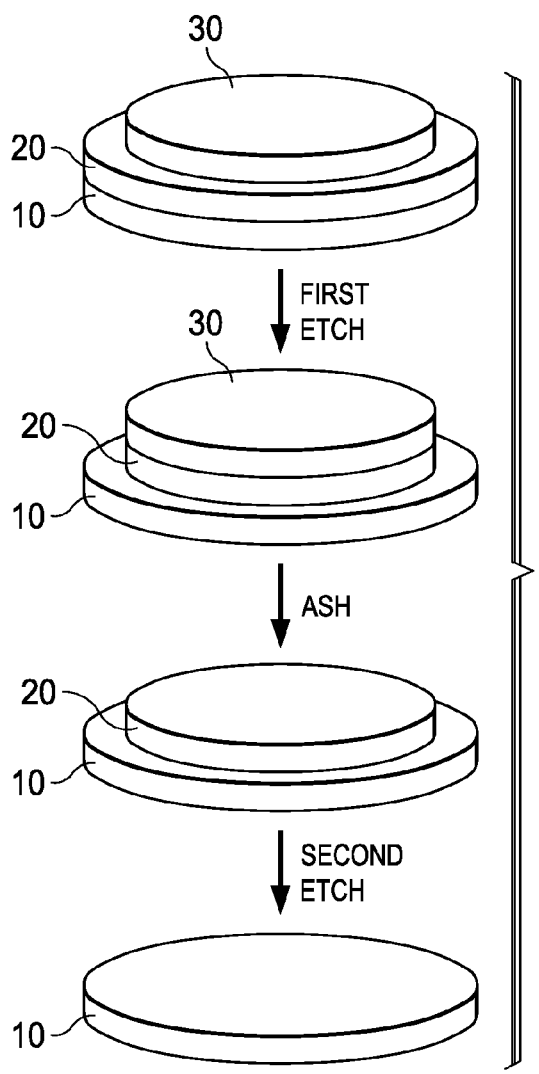
FIG. 3 is a drawing illustrating various steps of an example method using a semiconductor wafer with an example photoresist pattern according to teachings of the present disclosure.

FIG. 3 is a drawing illustrating various steps of example method 100 using a semiconductor wafer 10 with an example photoresist pattern 30 according to teachings of the present disclosure. As shown at the top of FIG. 3, wafer 10 includes a layer of film 20 and a photoresist pattern 30. As described above, photoresist pattern 30 may cover the center region of wafer 10 and expose the edge region of wafer 10, including the film 20 on the edge region of the wafer 10.

A first etch process, e.g., a plasma etch as described above, removes, or etches, any portion of film 20 that is not protected by the photoresist 30. As shown in FIG. 3, the first etch leaves wafer 10, photoresist 30, and a portion of film 20 that is protected by the photoresist 30. In the example shown, photoresist 30 and the remaining portion of film 20 are in the center region of wafer 10. The rate at which the etch process removes the film 20 in the edge region of wafer 10 may be referred to as an edge etch rate. If the film 20 is of a known thickness, the edge etch rate may be determined by measuring the time required to remove the entire thickness of the film 20 in the exposed edge areas.

A plasma ash, or another appropriate process may be used to remove photoresist 30. As shown in FIG. 3, the ash leaves wafer 10 with a layer of film 20 only in the center region, e.g., that area previously protected from the etch process by the photoresist.

A second etch process, e.g., a plasma etch as described above, removes or etches the remaining film 20, as shown in the center region of wafer 10. Because there is no photoresist remaining, all of the remaining film 20 is subject to the etch process. The rate at which the etch process proceeds through the remaining film 20, then, may be referred to as the center etch rate. If the film 20 is of a known thickness, the center etch rate may be determined by measuring the time required to remove the entire thickness of the film 20 in the exposed center area.

Figure 4:
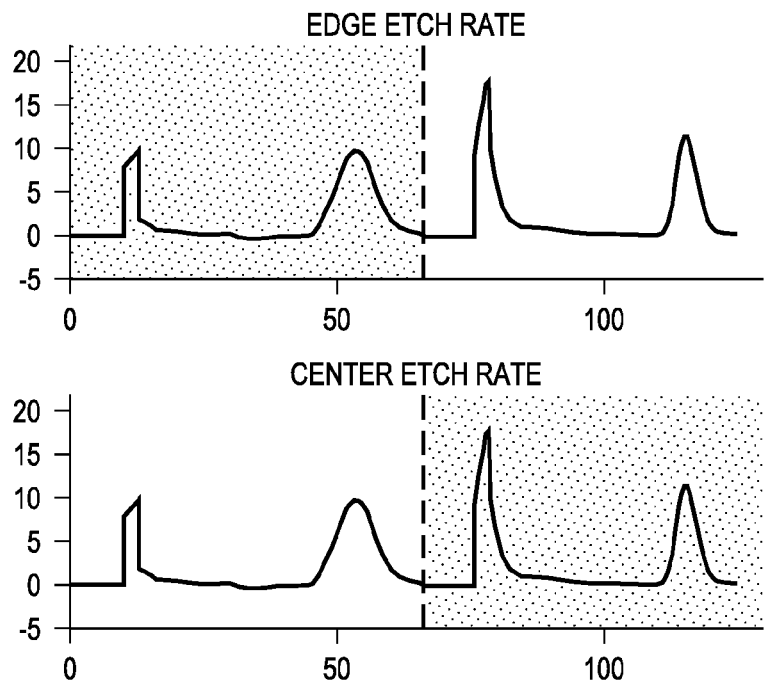
FIG. 4 is a drawing of a graph showing an example data set that may be gathered during a qualifying process according to teachings of the present disclosure.

FIG. 4 is a drawing of two graphs showing example data sets that may be gathered during an example qualifying process (e.g., method 100) according to teachings of the present disclosure. As shown, both data sets are identical. The left two peaks reflect the edge etch rate and the right two peaks reflect the center etch rate. In one embodiment, the etch rates are measured in nanometers per minute (nm/min), but any appropriate dimension may be used. In some examples, one peak in each set may reflect the measured etch rate and the other peak may represent the expected or threshold etch rate. The qualifying process, then, provides a measured etch rate which may be compared to the threshold to determine whether the plasma chamber is within specification (e.g., "qualified") or out of spec. If the chamber is out of spec, the qualifying processes described herein may avoid creating scrap or waste product by alerting the technicians or other operators to investigate and/or correct the conditions in the plasma chamber before conducting further processes.

Figure 5:
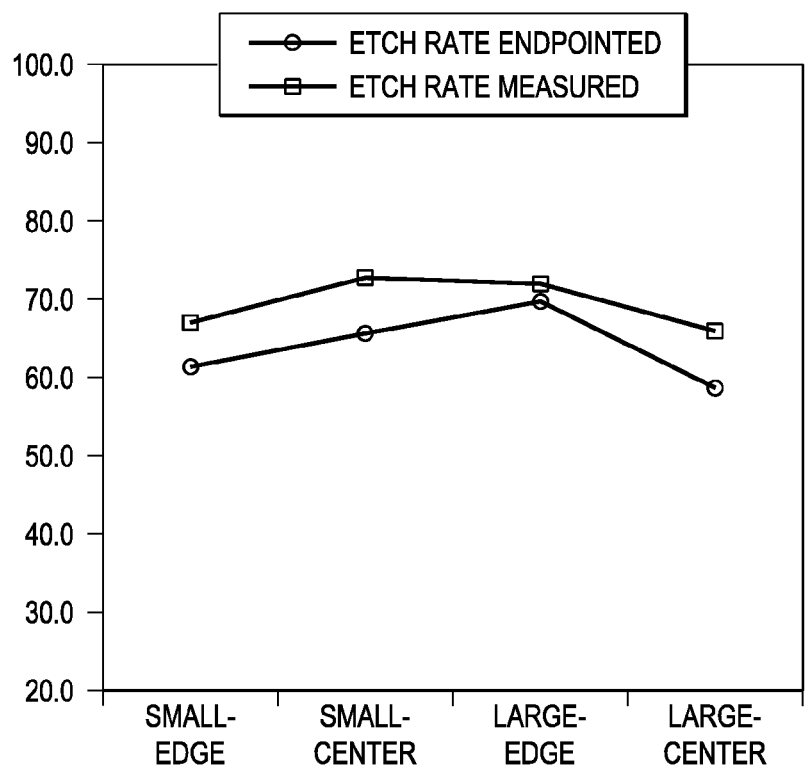
FIG. 5 is a graph showing a set of experimental data gathered during an example qualifying process according to teachings of the present disclosure.

FIG. 5 is a graph showing a set of experimental data gathered during an example qualifying process according to teachings of the present disclosure. As shown in FIG. 5, the measured etch rate shows the labelled etch rates as measured using the teachings of the present disclosure. The 'endpointed' etch rate shows etch rates as calculated based on other processes including additional metrology or other steps. The teachings of the present disclosure may be implemented to provide qualification processes that are simpler and more efficient and, therefore, cheaper, without losing the ability to properly qualify plasma chambers.

The invention claimed is:

1. A method for testing a semiconductor plasma etch chamber, the method comprising:
    depositing a film on a substrate of a wafer, the wafer including a center region and an edge region;
    depositing photoresist on top of the film in a pattern that isolates the center region from the edge region of the wafer;
    performing an etch process on the wafer that includes at least three process steps, the at least three process steps including:
        etching the film in any areas without photoresist covering the areas until a first clear endpoint signal is achieved;
        after the first clear endpoint signal is achieved, performing an in-situ ash to remove any photoresist; and
        after performing an in-situ ash, etching the film in any areas exposed by the removal of the photoresist until a second clear endpoint is achieved;
    determining whether both endpoints are achieved within respective previously set tolerances; and
    if both endpoints are achieved within the previously set tolerance, qualifying the plasma etch chamber as verified.

2. A method according to claim 1, wherein the photoresist is deposited in a pattern that covers the film disposed in the center region of the wafer and exposes the film deposited in the edge region of the wafer.

3. A method according to claim 1, wherein the previously set tolerance corresponding to the first clear endpoint reflects an edge etch rate for the plasma chamber.

4. A method according to claim 1, wherein the previously set tolerance corresponding to the second clear endpoint reflects a center etch rate for the plasma chamber.

5. A method according to claim 1, further comprising measuring the film after it is deposited on the substrate and before depositing the photoresist.

6. A method according to claim 1, wherein the wafer is stored for up to three months after deposition of the photoresist and before preforming the etch process.

7. A method according to claim 1, wherein the film comprises silicon dioxide.

8. A method according to claim 1, further comprising printing the photoresist with a mask-less photolithography process.

9. A method according to claim 1, further comprising measuring the thickness of the film to compare to a predetermined tolerance before depositing the photoresist.

10. A method for testing an etch rate uniformity for a plasma etch chamber, the method comprising:

etching an exposed portion of film on an edge region of a wafer, while a center region of the wafer is protected by photoresist and recording an etch rate for the edge region;

after etching the exposed portion of film on the edge region, performing an ash process to remove the photoresist form the center region of the wafer; and after performing the ash process, etching the center region of the wafer and recording an etch rate for the center region.

11. A method according to claim 10, further comprising comparing the etch rate for the edge region and the etch rate for the center region against respective predetermined thresholds.

12. A method according to claim 11, further comprising approving the plasma chamber as qualified if both etch rates fall within the respective predetermined thresholds.

13. A method according to claim 10, further comprising depositing the film on the wafer.

14. A method according to claim 10, further comprising:
depositing the film on the wafer; and
depositing photoresist on the film in a pattern that exposes the edge region of the wafer and the film thereon.

15. A method according to claim 10, wherein the film comprises silicon dioxide.

16. A method according to claim 10, further comprising:
depositing the film on the wafer; and
measuring the thickness of the film to compare to a predetermined tolerance.

17. A method for testing a semiconductor plasma etch chamber, the method comprising:
depositing a film on a substrate of a wafer, the wafer including a center region and an edge region;
depositing photoresist on top of the film in a pattern that isolates the center region from the edge region of the wafer;
performing an etch process on the wafer that includes at least three process steps, the at least three process steps including:
etching the film in any areas without photoresist covering the areas until a first clear endpoint signal is achieved;
performing an in-situ ash to remove any photoresist; and
etching the film in any areas exposed by the removal of the photoresist until a second clear endpoint is achieved;
determining whether both endpoints are achieved within respective previously set tolerances; and
if both endpoints are achieved within the previously set tolerance, qualifying the plasma etch chamber as verified,
wherein the wafer is stored for up to three months after deposition of the photoresist and before preforming the etch process.

* * * * *